United States Patent
Lee (10) Patent No.: US 8,730,714 B2
(45) Date of Patent: May 20, 2014

(54) MAGNETIC TUNNEL JUNCTION AND SPIN TRANSFER TORQUE RANDOM ACCESS MEMORY HAVING THE SAME

(75) Inventor: Seung Hyun Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 194 days.

(21) Appl. No.: 13/336,102

(22) Filed: Dec. 23, 2011

(65) Prior Publication Data

US 2013/0039121 A1 Feb. 14, 2013

(30) Foreign Application Priority Data

Aug. 9, 2011 (KR) .......................... 10-2011-0078969

(51) Int. Cl.
*G11C 11/00* (2006.01)
(52) U.S. Cl.
USPC ............................ 365/158; 365/171; 365/173
(58) Field of Classification Search
USPC ......................................... 365/158, 171, 173
See application file for complete search history.

(56) References Cited

U.S. PATENT DOCUMENTS

| | | | |
|---|---|---|---|
| 8,406,041 B2 * | 3/2013 | Shukh | 365/158 |
| 8,411,494 B2 * | 4/2013 | Shukh | 365/158 |
| 2006/0152973 A1 * | 7/2006 | Lin et al. | 365/173 |
| 2006/0267056 A1 * | 11/2006 | Ju et al. | 257/295 |

* cited by examiner

*Primary Examiner* — Connie Yoha
(74) *Attorney, Agent, or Firm* — IP & T Group LLP

(57) ABSTRACT

A magneto-resistance memory device includes a first pinned layer having a first magnetic polarity regardless of current applied to the first pinned layer, a first tunnel insulating layer arranged on the first pinned layer, a first free layer arranged on the first tunnel insulating layer and having a magnetic polarity that changes in response to current of a first amount, a second pinned layer coupled to the first free layer and having the first magnetic polarity regardless of current applied to the first pinned layer, a second tunnel insulating layer arranged on the second pinned layer, a second free layer arranged on the second tunnel insulating layer and having a magnetic polarity that changes in response to current of a second amount, wherein the second amount is smaller than the first amount, and a connection layer.

18 Claims, 5 Drawing Sheets

MAGNETIC TUNNEL JUNCTION AND SPIN TRANSFER TORQUE RANDOM ACCESS MEMORY HAVING THE SAME

CROSS-REFERENCE(S) TO RELATED APPLICATIONS

The present application claims priority of Korean Patent Application No. 10-2011-0078969, filed on Aug. 9, 2011, which is incorporated herein by reference in its entirety.

BACKGROUND OF THE INVENTION

The present invention relates to a magnetic tunnel junction device and a memory device including the magnetic tunnel junction device, and more particularly to a magnetic tunnel junction device for storing multi-bit data in a limited area and having an advantage of scalability and a magneto-resistance memory device including the magnetic tunnel junction device.

A dynamic random access memory (DRAM), which is one of the most widely used semiconductor memory device, has advantages of high operation speed and high integration. However, the DRAM is a volatile memory device which loses data when a power is off, and a refresh process is periodically performed to prevent loss of stored data during operation. On the other hand, while a flash memory is a non-volatile memory device capable of high integration, the flash memory has slow operation speeds. In addressing above features of the DRAM and the flash memory, magneto-resistance random memory devices (MRAM) exhibit non-volatility, high operation speed, and high integration (scalability) capacity.

More specifically, an MRAM device is a non-volatile memory device where data is stored by magnetic storage elements having different resistance states according to magnetic field changes between ferromagnetic plates. The magnetic storage element is a component including two ferromagnetic plates separated by an insulating layer. If polarities of the two ferromagnetic plates are parallel (that is, their respective magnetic polarities are in the same directions), resistance of magnetic storage element is minimized. However, if polarities of the two ferromagnetic plates are oppositely oriented (that is, their respective magnetic polarities are in the opposite directions), the resistance is maximized. The MRAM device stores data based on cell's resistance changes according to magnetization of ferromagnetic plates in the magnetic storage element. As a magnetic storage element, a Magnetic Tunnel Junction (MD) is often used.

In the MRAM, the MTJ generally includes a stacked structure of a ferromagnetic layer, an insulating layer, and another ferromagnetic layer. When electrons passing through a first ferromagnetic layer enter an insulating layer serving as a tunneling barrier, electron's probability to penetrate into the insulating layer is determined by a magnetic direction of second ferromagnetic layer. If two ferromagnetic layers have the same polarity (that is, in a parallel magnetic direction), amount of current tunneling the insulating layer is maximized. Otherwise, if two ferromagnetic layers have opposite magnetic directions, amount of current is minimized. For example, when resistance recognized based on the tunneling current is high, information stored in the MTJ is in a logic level "1" (or "0"). If the resistance is low, information is in a logic level "0" (or "1"). Herein, one of two ferromagnetic layers is called a pinned layer because its polarity is set to particular set value, but the other is called a free layer because its polarity can be changed according to applied magnetic fields or supplied currents. Here, directions of a magnetic polarity can be along a horizontal plane or a vertical plane and can be along different directions in different layers having the magnetic polarity as appropriate. An MRAM includes a memory cell unit constituted with one transistor and one magneto-resistance storage element. When the memory cell unit typically stores one-bit data, an MRAM device includes a lot of memory cell units to store multi-bit data. However, as MRAMs are scaled down to be cost effective, storing one-bit data in a single memory cell unit is no longer a competitive method.

SUMMARY OF THE INVENTION

An embodiment of the present invention is directed to a magneto-resistive storage element, which can store multi-bit data, and a magneto-resistive random access memory (MRAM) including the magneto-resistive storage element.

An embodiment of the present invention is directed to a MRAM having an advantage of scalability or density.

In accordance with an embodiment of the present invention, a magneto-resistance storage element includes a first pinned layer having a first magnetic polarity regardless of current applied to the first pinned layer, a first tunnel insulating layer arranged on the first pinned layer, a first free layer arranged on the first tunnel insulating layer and having a magnetic polarity that changes in response to current of a first amount, a second pinned layer coupled to the first free layer and having the first magnetic polarity regardless of current applied to the first pinned layer, a second tunnel insulating layer arranged on the second pinned layer, a second free layer arranged on the second tunnel insulating layer and having a magnetic polarity that changes in response to current of a second amount, wherein the second amount is smaller than the first amount, and a connection layer arranged to couple the first free layer to the second pinned layer.

In accordance with another embodiment of the present invention, a magneto-resistance memory device includes a magneto-resistance storage element including plural magnetic units serially connected to each other, wherein magnetic polarities of the magnetic units are changed in response to current of different amounts, respectively, a switching device connected to the magneto-resistance storage element and configured to select the magneto-resistance storage element in response to an address signal and to supply current to the magneto-resistance storage element, and a bit line connected to the magneto-resistance storage element and configured to supply current to the magneto-resistance storage element.

In accordance with another embodiment of the present invention, a magneto-resistance storage element includes a first free layer arranged on the first tunnel insulating layer and having a magnetic polarity changed in response to current of a first amount, a first tunnel insulating layer arranged on the first free layer, a first pinned layer having a first magnetic polarity regardless of current applied to the first pinned layer, a second pinned layer coupled to the first pinned layer having the first magnetic polarity regardless of current applied to the second pinned layer, a second free layer arranged on the second tunnel insulating layer and having a magnetic polarity changed in response to current of a second amount smaller than the first amount, and a connection layer configured to couple the first pinned layer to the second pinned layer.

In accordance with another embodiment of the present invention, a magneto-resistance storage element includes a first pinned layer having a first magnetic polarity regardless of current applied to the first pinned layer, a first tunnel insulating layer arranged on the first pinned layer, a first free layer arranged on the first tunnel insulating layer and having a magnetic polarity changed in response to current of a first amount, a second free layer coupled to the first free layer and having a magnetic polarity changed in response to current of a second amount smaller than the first amount, a second tunnel insulating layer arranged on the second free layer, a second pinned layer arranged on the second tunnel insulating layer and having the first magnetic polarity, and a connection layer configured to couple the first free layer to the second free layer.

In accordance with another embodiment of the present invention, a magneto-resistance storage element includes a first free layer having a magnetic polarity changed in response to current of a first amount, a first tunnel insulating layer arranged on the first pinned layer, a first pinned layer arranged on the first tunnel insulating layer and having a first magnetic polarity regardless of current applied to the first pinned layer, a second free layer coupled to the first pinned layer and having a magnetic polarity changed in response to current of a second amount smaller than the first amount, a second tunnel insulating layer arranged on the second pinned layer, a second pinned layer arranged on the second tunnel insulating layer and having the first magnetic polarity regardless of current applied to the second pinned layer, and a connection layer configured to couple the first pinned layer to the second free layer.

DESCRIPTION OF SPECIFIC EMBODIMENTS

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
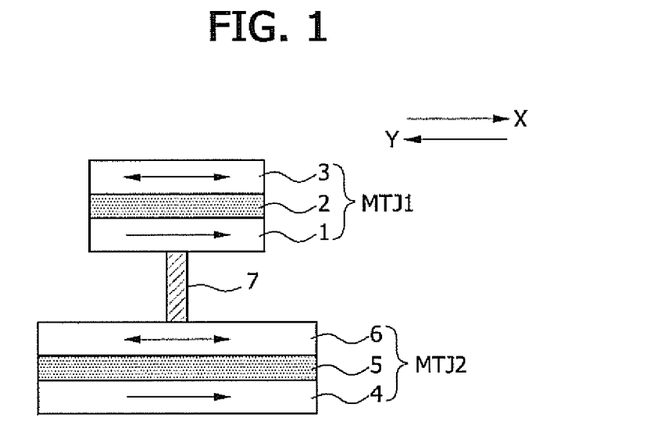
FIG. 1 is a block diagram showing a magneto-resistive storage element in accordance with an embodiment of the present invention.

FIG. 1 is a block diagram showing a magneto-resistive storage element in accordance with an embodiment of the present invention.

As shown, the magneto-resistive storage element is formed in a structure of two unit devices MTJ1 and MTJ2, connected in series, for storing two-bit data.

The first unit device MTJ1 includes a first pinned layer 1, a first tunnel insulating layer 2, and a first free layer 3. The first pinned layer 1 having a polarity set to a first direction X includes a first pinning plate and a first pinned plate. The first pinning plate serves to fix a magnetization direction of the first pinned plate. The first pinning plate can include at least one of materials marked by chemical formulae of IrMn, PtMn, MnO, MnS, MnTe, $MnF_2$, $FeF_2$, $FeCl_2$, FeO, $CoCl_2$, CoO, $NiCl_2$, and NiO. Further, the first pinned plate having a fixed polarity can include a material including at least one of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. The first tunnel insulating layer 2 can include MgO. Also, the first tunnel insulating layer 2 can be formed of a Group IV semiconductor material or a Group IV semiconductor material combined with Group III or V materials such as B, P, As. The first free layer 3 has a polarity changed according to direction of supplied current. The first free layer 3 can include a material including at least one of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second unit device MTJ2 includes a second pinned layer 4, a second tunnel insulating layer 5, and a second free layer 6. The second pinned layer 4 having a polarity set to a first direction X includes a second pinning plate and a second pinned plate. The second pinning plate serves to fix a magnetization direction of the second pinned plate. The second pinning plate can include a material including at least one of IrMn, PtMn, MnO, MnS, MnTe, $MnF_2$, $FeF_2$, $FeCl_2$, FeO, $CoCl_2$, CoO, $NiCl_2$, and NiO. Further, the second pinned plate having a fixed polarity can include a material including at least one of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. The second tunnel insulating layer 5 can include MgO. Also, the second tunnel insulating layer 5 can be formed of a Group IV semiconductor material or a Group IV semiconductor material combined with Group III or V materials such as B, P, As. The second free layer 6 has a polarity capable of being changed according to a direction of supplied current. The second free layer 6 can include a material including at least one of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The first pinned layer 1 of the first unit device MTJ1 is electrically coupled to the second free layer 6 of the second unit device MTJ2 by a contact plug 7 between the first unit device MTJ1 and the second unit device MTJ2. The contact plug 7 can include a conducting material such as a metal.

The first unit device MTJ1 and the second unit device MTJ2 have different electric and magnetic properties, respectively. Thus, if a certain amount of current flows into the first unit device MTJ1 and the second unit device MTJ2, the magnetic direction of the second free layer 6 in the second unit device MTJ2 may not changed even if the magnetic direction of the first free layer 3 in the first unit device MTJ1 is changed. Operation of the magneto-resistive storage element is described as follows.

FIGS. 2A to 2D are block diagrams depicting an operation of the magneto-resistive storage element shown in FIG. 1. The first unit device MTJ1 and the second unit device MTJ2 have operational properties shown in the following Table 1.

TABLE 1

| Bit Value | 0 (1st direction) Resistance (kΩ) | 1 (2nd direction) | 1→0 Current Amount (μA) | 0→1 |
|---|---|---|---|---|
| MTJ1 | 2 | 10 | 40 (from MTJ1 to MTJ2) | 50 (from MTJ2 to MTJ1) |

TABLE 1-continued

| Bit Value | 0 (1st direction) | 1 (2nd direction) | 1→0 | 0→1 |
|---|---|---|---|---|
| | Resistance (kΩ) | | Current Amount (μA) | |
| MTJ2 | 1 | 5 | 80 (from MTJ1 to MTJ2) | 100 (from MTJ2 to MTJ1) |

Referring to Table 1, the first unit device MTJ1 has a 2 kΩ resistance when a bit value is "0"; and a 10 kΩ resistance when a bit value is "1". To change the bit value of the first unit device from "1" to "0", 40 μA current is applied in the direction from MTJ1 to MTJ2. In a case of changing the bit value from "0" to "1", 50 μA current is applied in the direction from MTJ2 to MTJ1.

The second unit device MTJ2 has a 1 kΩ resistance when a bit value is "0"; and a 5 kΩ resistance when a bit value is "1". To change the bit value of the first unit device from "1" to "0", 80 μA current is applied in the direction from MTJ1 to MTJ2. In a case of changing the bit value from "0" to "1", 100 μA current is applied in the direction from MTJ2 to MTJ1.

Meanwhile, if the first and second unit devices MTJ1 and MTJ2 each have the bit value of "0", the first and second free layers 3 and 6 in the unit device MTJ1 and MTJ2 each have a magnetic direction of first direction X. If the first and second unit devices MTJ1 and MTJ2 each have the bit value of "1", the first and second free layers 3 and 6 in the unit devices MTJ1 and MTJ2 have a magnetic direction of a second direction Y. In either of these cases, magnetic directions of the first and second pinned layers 1 and 4 are set to the first direction X.

Figure 2A:
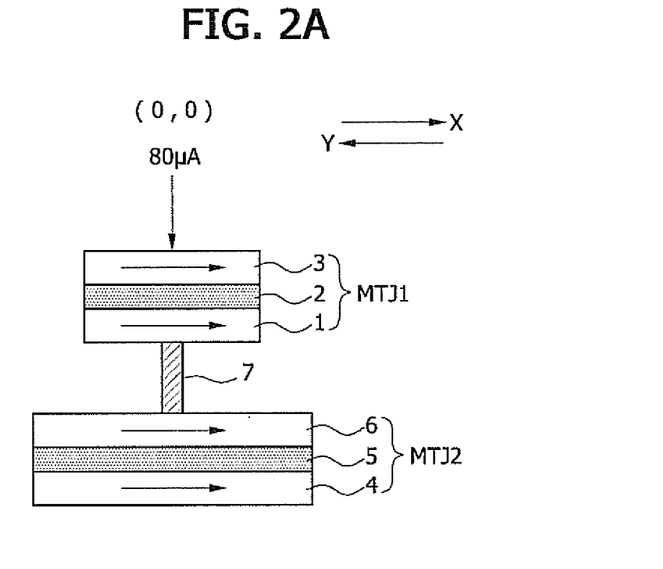
FIGS. 2A to 2D are block diagrams depicting operation of the magneto-resistive storage element shown in FIG. 1.

Referring to FIG. 2A, 80 μA current is supplied from the first free layer 3 to the second pinned layer 4. Because the 80 μA current applied in the direction from MTJ1 to MTJ2 is enough to change magnetic directions of the first and second free layers 3 and 6 to the first direction X (bit value of "0") as shown in Table 1, the magnetic directions of the first and second free layers 3 and 6 are changed to the first direction X. That is, the unit device MTJ1 and MTJ2 respectively store the bit value of "0", and total resistance of the magneto-resistive storage element is 3 kΩ. When 3 kΩ resistance is detected to be the overall resistance of MTJ1 and MTJ2, a magneto-resistive random access memory recognizes that the magneto-resistive storage element stores 2-bit data (0, 0).

Figure 2B:
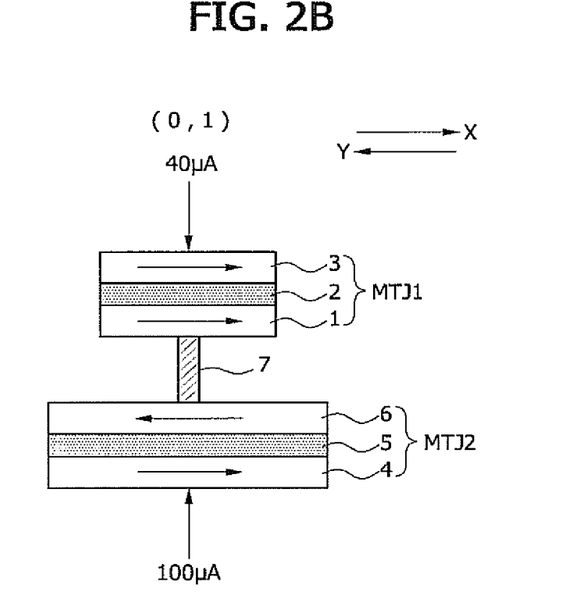

Referring to FIG. 2B, 100 μA current is supplied from the second pinned layer 4 to the first free layer 3. Because the 100 μA current applied in the direction from MTJ2 to MTJ1 is enough to change magnetic directions of the first and second free layers 3 and 6 to the second direction Y (bit value of "1") as shown in Table 1, the magnetic directions of the first and second free layers 3 and 6 are changed to the second direction Y. Subsequently, 40 μA current is supplied from the first free layer 3 to the second pinned layer 4. Because the 40 μA current applied in the direction from MTJ1 to MTJ2 is enough to change magnetic direction of the first free layer 3 as shown in Table 1, the magnetic direction of the first free layer 3 is changed to the first direction X. That is, the first unit device MTJ1 stores the bit value of "0", and the second unit device MTJ2 stores the bit value of "1". Total resistance of the magneto-resistive storage element is 7 kΩ. If the 7 kΩ resistance is detected as the total resistance of MTJ1 and MTJ2, a magneto-resistive random access memory recognizes that the magneto-resistive storage element stores 2-bit data (0, 1).

Figure 2C:
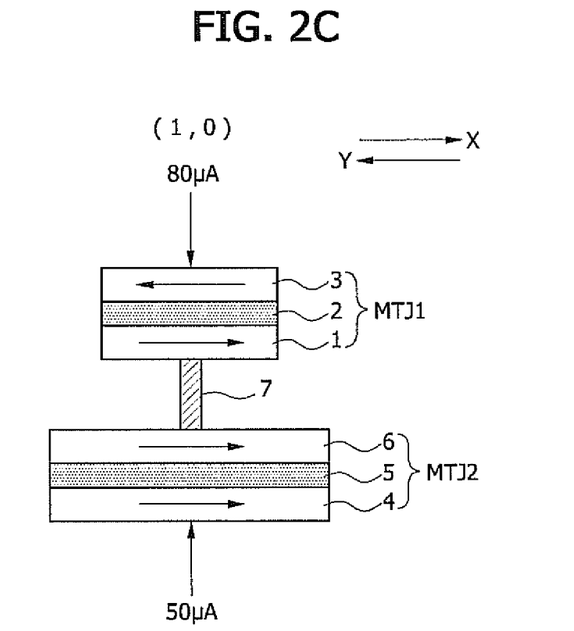

Referring to FIG. 2C, 80 μA current is supplied from the first free layer 3 to the second pinned layer 4. Because the 80 μA current applied in the direction from MTJ1 to MTJ2 is enough to change magnetic directions of the first and second free layers 3 and 6 as shown in Table 1, the magnetic directions of the first and second free layers 3 and 6 are changed to the first direction X. Subsequently, 50 μA current is supplied from the second pinned layer 4 to the first free layer 3. Because the 50 μA current applied in the direction from MTJ2 to MTJ1 is enough to change magnetic direction of the first free layer 3 as shown in Table 1, the magnetic direction of the first free layer 3 is changed to the second direction Y. That is, the first unit device MTJ1 stores the bit value of "1", and the second unit device MTJ2 stores the bit value of "0". Total resistance of the magneto-resistive storage element is 11 kΩ. When the 11 kΩ resistance is detected as the total resistance of MTJ1 and MTJ2, a magneto-resistive random access memory recognizes that the magneto-resistive storage element stores 2-bit data (1, 0).

Figure 2D:
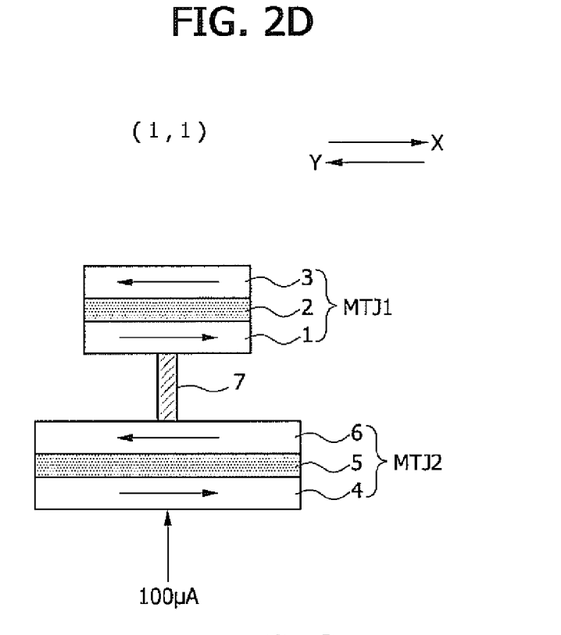

Referring to FIG. 2D, 100 μA current is supplied from the second pinned layer 4 to the first free layer 3. Because the 100 μA current applied in the direction from MTJ2 to MTJ1 is enough to change magnetic directions of the first and second free layers 3 and 6 as shown in Table 1, the magnetic directions of the first and second free layers 3 and 6 are changed to the second direction Y. That is, the first and second unit device MTJ1 and MTJ2 respectively store the bit value of "1", and total resistance of the magneto-resistive storage element is 15 kΩ. If the 15 kΩ resistance is detected as the total resistance of MTJ1 and MTJ2, a magneto-resistive random access memory recognizes that the magneto-resistive storage element stores 2-bit data (1, 1).

In the magneto-resistive storage element of the embodiment, two unit devices MTJ1 and MTJ2 having different electronic and magnetic properties are connected in series. By changing magnetic direction of the two unit devices MTJ1 and MTJ2, the magneto-resistive storage element has four different resistance values. Thus, the magneto-resistive random access memory can read and write 2-bit data in a single magneto-resistive storage element.

Figure 3:
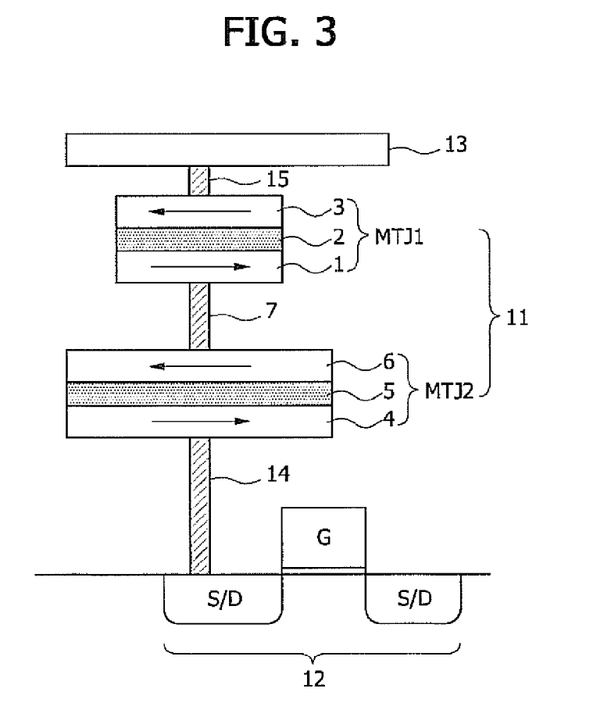
FIG. 3 is a block diagram describing one unit memory cell of magneto-resistive random access memory in accordance with another embodiment of the present invention.

FIG. 3 is a block diagram describing one unit memory cell of magneto-resistive random access memory in accordance with another embodiment of the present invention.

As shown, the single unit memory cell of magneto-resistive random access memory includes a single magneto-resistance storage element 11, a single switching device 12, and a single bit line 13.

The single magneto-resistance storage element 11 includes two unit devices MTJ1 and MTJ2 serially connected to each other in order to store 2-bit data. A magnetic direction of each unit device MTJ1 and MTJ2 is changed according to currents having different amounts and directions so that resistance of the magneto-resistance storage element 11 has four different values. Operation of the magneto-resistance storage element 11 is similar to that of the magneto-resistive storage element shown in FIGS. 1 and 2A to 2D.

The switching device 12, connected to the magneto-resistance storage element, selects the magneto-resistance storage element 11 in response to an address signal inputted from an external device, and supplies currents to the magneto-resistance storage element 11 for changing magnetic directions of the free layer 3 and 6 included in the magneto-resistive storage element 11 to the second direction Y. The switching device 12 includes a transistor having one source/drain, which is electronically coupled to the first pinned layer 4 through a contact plug 14.

The bit line 13, connected to the magneto-resistance storage element 11, supplies currents to the magneto-resistance storage element 11 to change magnetic direction of the free layers 3 and 6 into the first direction X. The bit line 13 including a wire for delivering current is coupled to the first free layer 3 through a contact plug 15.

A single memory cell can store 2-bit data because the single magneto-resistance storage element 11 stores 2-bit data. According to the exemplary embodiment of the present invention, a magneto-resistance storage element can store 2-bit data in a single memory cell having a switching device and a magneto-resistance storage element to double the storage capacity of data in each storage element. Thus, by storing the 2-bit data in each magneto-resistance storage element, the magneto-resistance memory device of the embodiments can be scaled down by reducing the number of switching devices.

Figure 4A:
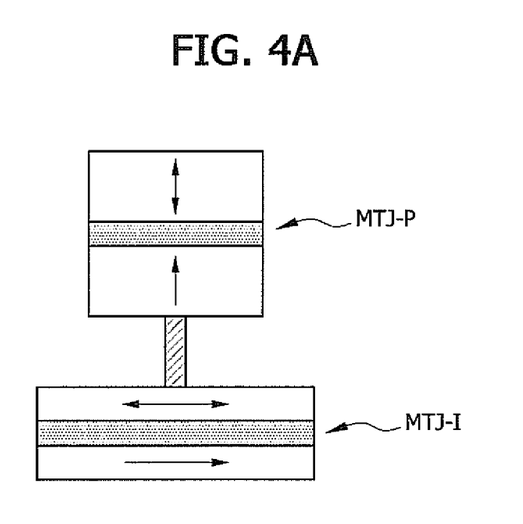
FIGS. 4A to 4C are block diagram showing magneto-resistive storage elements in accordance with other embodiments of the present invention.
Figure 4B:
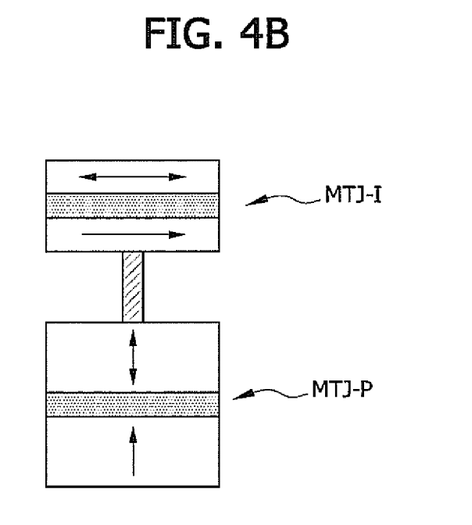
Figure 4C:
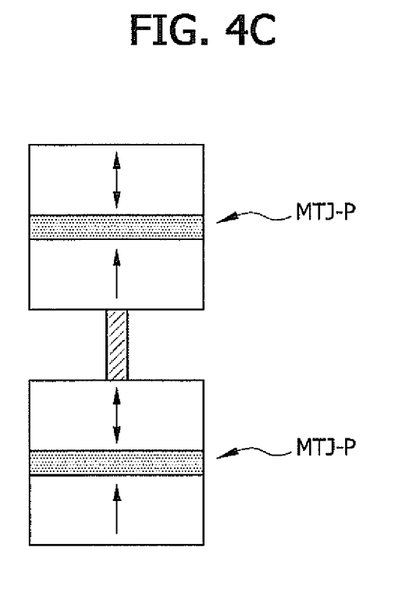

FIGS. 4A to 4C are block diagram showing magneto-resistive storage elements in accordance with other embodiments of the present invention. As shown, magneto-resistive storage elements according to exemplary embodiments of the present invention may have the order of pinned layers, tunnel insulating layers and free layers changed within each magnetic unit without changing the above-discussed operations of the magnetic units. For example, the order of the pinned layers and free layers with magnetic units may be switched for one another without changing the above-discussed operations of the magnetic units.

Referring to FIGS. 4A to 4C, the magneto-resistive storage element includes a first unit device MTJ-I having a horizontal magnetic direction and a second unit device MTJ-P having a vertical magnetic direction selectively. Herein, the second unit device MTJ-P has a smaller plan size than the first unit device MTJ-I. Thus, when the magneto-resistive storage element includes the second unit device MTJ-P without the first unit device MTJ-I, a plan area of the magneto-resistive storage element can be reduced. Since detailed operation of the magneto-resistive storage elements shown in FIGS. 4A to 4C is similar to those shown in FIGS. 2A to 2D, the description about operations is omitted herein.

In exemplary embodiments of the present invention, the magneto-resistance memory device includes a memory cell having one magneto-resistance storage element configured to store 2-bit data and one switching device. According to the exemplary embodiments, a magneto-resistance memory device can store 2-bit data in a single memory cell having a structure of one switching devices and two magneto-resistance storage elements. Thus, the magneto-resistance memory device of the exemplary embodiments can be scaled down by reducing the number of switching devices.

As discussed earlier, in accordance with exemplary embodiments of the present invention, the magneto-resistance memory device includes plural memory cells, each having one magneto-resistance storage element configured to store multi-bit data and one switching device. Here, one switching device is coupled to plural magneto-resistance units so that one memory cell can store multi-bit data. According to another exemplary embodiment of the present invention, each memory device may be designed to store n-bit data, and the overall area for the magneto-resistance memory device can be reduced by the area equivalent to the space occupied by (n−1) number of switching devices.

While the present invention has been described with respect to the specific embodiments, it will be apparent to those skilled in the art that various changes and modifications may be made without departing from the spirit and scope of the invention as defined in the following claims.

What is claimed is:

1. A magneto-resistance storage element, comprising:
   a first magnetic tunnel junction (MTJ) including a first pinned layer, a first tunnel insulating layer and a first free layer;
   a second MTJ including a second pinned layer, a second tunnel insulating layer and a second free layer; and
   a connection layer,
   wherein the first pinned layer has a first magnetic polarity regardless of current applied to the first pinned layer,
   the first tunnel insulating layer is arranged on the first pinned layer,
   the first free layer is arranged on the first tunnel insulating layer and has a magnetic polarity that changes in response to current of a first amount,
   the second pinned layer is coupled to the first free layer and has the first magnetic polarity regardless of current applied to the first pinned layer,
   the second tunnel insulating layer is arranged on the second pinned layer,
   the second free layer is arranged on the second tunnel insulating layer and has a magnetic polarity that changes in response to current of a second amount,
   the connection layer is arranged to couple the first free layer to the second pinned layer, and
   wherein when the current of the second amount is smaller than the current of the first amount, the first MTJ stores a bit value of "1" and the second MTJ stores a bit value of "0".

2. The magneto-resistance storage element as recited in claim 1, wherein, when current of the first amount is supplied, the first and second free layers are configured to set their respective magnetic polarities to the first magnetic polarity.

3. The magneto-resistance storage element as recited in claim 1, wherein, when current of the second amount is supplied, the first free layer is not configured to change the magnetic polarity of the first free layer.

4. The magneto-resistance storage element as recited in claim 1, wherein when the first and second free layers each have the first magnetic polarity, the second free layer is configured to change the magnetic polarity of the second free layer to a magnetic polarity opposite to the first magnetic polarity in response to current of the second amount.

5. The magneto-resistance storage element as recited in claim 1, wherein the first and second free layers are each configured to have a magnetic polarity opposite to the first magnetic polarity in response to current of the first amount.

6. The magneto-resistance storage element as recited in claim 1, wherein a direction of the first magnetic polarity of the first pinned layer is perpendicular to a direction of the first magnetic polarity of the second pinned layer.

7. A magneto-resistance memory device, comprising:
   a magneto-resistance storage element including plural magnetic units serially connected to each other, wherein magnetic polarities of the magnetic units are changed in response to current of different amounts, respectively;
   a switching device connected to the magneto-resistance storage element and configured to select the magneto-resistance storage element in response to an address signal and to supply current to the magneto-resistance storage element; and
   a bit line connected to the magneto-resistance storage element and configured to supply current to the magneto-resistance storage element,
   wherein a first magnetic unit of the plural magnetic units changes a magnetic polarity in response to current of a first amount, and a second magnetic unit of the plural magnetic units changes a magnetic polarity in response to current of a second amount, and when the current of the second amount is smaller than the current of the first amount, the first magnetic unit stores a bit value of "1" and the second magnetic unit stores a bit value of "0".

8. The magneto-resistance memory device as recited in claim 7, wherein, when current of a first amount is supplied to the magnetic units of the magneto-resistance storage element, some of the magnetic units are configured to change their respective magnetic polarities while magnetic polarities of remaining ones of the magnetic units are not configured to change.

9. The magneto-resistance memory device as recited in claim 7, wherein the magnetic units include:
a first magnetic unit having a first pinned layer having a first magnetic polarity regardless of current applied to the first pinned layer, a first tunnel insulating layer arranged on the first pinned layer, and a first free layer arranged on the first tunnel insulating layer; and
a second magnetic unit having a second pinned layer coupled to the first free layer, a second tunnel insulating layer arranged on the second pinned layer, and a second free layer arranged on the second tunnel insulating layer, wherein the second pinned layer has the first magnetic polarity regardless of current applied to the second pinned layer.

10. The magneto-resistance memory device as recited in claim 9, wherein, when current of a larger amount than a reference amount is supplied to the magneto-resistance storage element, the first and second free layers are configured to change their respective magnetic polarities to the first magnetic polarity.

11. The magneto-resistance memory device as recited in claim 10, wherein, when current of a smaller amount than the reference amount is supplied to the magneto-resistance storage element, one of the first and second free layers is configured to change a magnetic polarity to the first magnetic polarity while the other one of the first and second free layers is not configured to change a magnetic polarity.

12. The magneto-resistance memory device as recited in claim 9, wherein the first and second free layers are each configured to have a magnetic polarity opposite to the first magnetic polarity in response to current of a first amount.

13. The magneto-resistance memory device as recited in claim 7, wherein a magnetic unit of the magneto-resistance storage element is configured to change a magnetic polarity when current of a first amount is applied in a first direction to the magneto-resistance storage element but not when current of the first amount is applied in a direction opposite to the first polarity.

14. The magneto-resistance memory device as recited in claim 9, wherein a direction of the first magnetic polarity of the first pinned layer is perpendicular to a direction of the first magnetic polarity of the second pinned layer.

15. The magneto-resistance memory device as recited in claim 9, wherein the switching device includes a transistor coupled to the first pinned layer.

16. A magneto-resistance storage element, comprising:
a first magnetic tunnel junction (MTJ) including a first pinned layer, a first tunnel insulating layer and a first free layer;
a second MTJ including a second pinned layer, a second tunnel insulating layer and a second free layer; and
a connection layer,
wherein the first free layer is arranged on the first tunnel insulating layer and has a magnetic polarity changed in response to current of a first amount,
the first tunnel insulating layer is arranged on the first free layer,
the first pinned layer has a first magnetic polarity regardless of current applied to the first pinned layer,
the second pinned layer is coupled to the first pinned layer having the first magnetic polarity regardless of current applied to the second pinned layer,
the second tunnel insulating layer is arranged on the second pinned layer,
the second free layer is arranged on the second tunnel insulating layer and has a magnetic polarity changed in response to current of a second amount,
the connection layer couples the first pinned layer to the second pinned layer, and
wherein when the current of the second amount is smaller than the current of the first amount, the first MTJ stores a bit value of "1" and the second MTJ stores a bit value of "0".

17. A magneto-resistance storage element, comprising:
a first magnetic tunnel junction (MTJ) including a first pinned layer, a first tunnel insulating layer and a first free layer;
a second MTJ including a second pinned layer, a second tunnel insulating layer and a second free layer; and
a connection layer,
wherein the first pinned layer has a first magnetic polarity regardless of current applied to the first pinned layer,
the first tunnel insulating layer is arranged on the first pinned layer,
the first free layer is arranged on the first tunnel insulating layer and has a magnetic polarity changed in response to current of a first amount,
the second free layer is coupled to the first free layer and has a magnetic polarity changed in response to current of a second amount smaller than the first amount,
the second tunnel insulating layer arranged on the second free layer,
the second pinned layer arranged on the second tunnel insulating layer and having the first magnetic polarity, and
the connection layer couples the first free layer to the second free layer, and
wherein when the current of the second amount is smaller than the current of the first amount, the first MTJ stores a bit value of "1" and the second MTJ stores a bit value of "0".

18. A magneto-resistance storage element, comprising:
a first magnetic tunnel junction (MTJ) including a first pinned layer, a first tunnel insulating layer and a first free layer;
a second MTJ including a second pinned layer, a second tunnel insulating layer and a second free layer; and
a connection layer,
wherein the first free layer has a magnetic polarity changed in response to current of a first amount,
the first tunnel insulating layer arranged on the first pinned layer,
the first pinned layer arranged on the first tunnel insulating layer and having a first magnetic polarity regardless of current applied to the first pinned layer,
the second free layer coupled to the first pinned layer and having a magnetic polarity changed in response to current of a second amount smaller than the first amount, the second tunnel insulating layer arranged on the second free layer, the second pinned layer arranged on the second tunnel insulating layer and having the first magnetic polarity regardless of current applied to the second pinned layer, the connection layer configured to couple the first pinned layer to the second free layer, and wherein when the current of the second amount is smaller than the current of the first amount, the first MTJ stores a bit value of "1" and the second MTJ stores a bit value of "0".

* * * * *